(12) United States Patent
Yamaoka (10) Patent No.: US 6,777,751 B2
(45) Date of Patent: Aug. 17, 2004

(54) SEMICONDUCTOR DEVICE AND METHOD FOR FABRICATING THE SAME

(75) Inventor: Tohru Yamaoka, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/394,031

(22) Filed: Mar. 24, 2003

(65) Prior Publication Data

US 2003/0209763 A1 Nov. 13, 2003

(30) Foreign Application Priority Data

May 9, 2002 (JP) ........................................ 2002-133715

(51) Int. Cl.[7] ............................................. H01L 27/01
(52) U.S. Cl. ..................... 257/347; 257/346; 257/347; 257/348; 257/349; 257/354; 257/356; 257/374
(58) Field of Search ................................ 257/347, 346, 257/348, 349, 354, 356, 374

(56) References Cited

U.S. PATENT DOCUMENTS

| | | | | |
|---|---|---|---|---|
| 5,225,356 A | * | 7/1993 | Omura et al. ................. | 437/21 |
| 5,309,010 A | * | 5/1994 | Kitajima ..................... | 257/347 |
| 5,554,546 A | * | 9/1996 | Malhi .......................... | 437/40 |
| 5,654,573 A | * | 8/1997 | Oashi et al. ................. | 257/349 |
| 5,930,642 A | * | 7/1999 | Moore et al. ................ | 438/407 |
| 6,114,741 A | * | 9/2000 | Joyner et al. ................ | 257/506 |
| 6,214,657 B1 | * | 4/2001 | Lee ............................. | 438/219 |
| 6,596,615 B2 | * | 7/2003 | Ipposhi et al. .............. | 438/586 |
| 6,621,123 B1 | * | 9/2003 | Nakabayashi et al. ...... | 257/347 |
| 6,646,296 B2 | * | 11/2003 | Horiuchi ..................... | 257/288 |

* cited by examiner

Primary Examiner—Allan R. Wilson
Assistant Examiner—Edgardo Ortiz
(74) Attorney, Agent, or Firm—McDermott Will & Emery LLP (57) ABSTRACT

A semiconductor device in accordance with the present invention includes: an insulating layer; a semiconductor region formed on the insulating layer; a trench that surrounds side parts of the semiconductor region and reaches the insulating layer; an isolation insulating film formed in the trench; a semiconductor element in which the semiconductor region serves as an active region; a side oxide film formed by oxidizing the side parts of the semiconductor region and located between the rest of the semiconductor region and the isolation insulating film; and a bottom oxide film that is formed by oxidizing a bottom part of the semiconductor region, located over the entire interface between the rest of the semiconductor region and the insulating layer, and having side surfaces that reach the side oxide film.

9 Claims, 9 Drawing Sheets

Ratio between defect densities of IGFETs having different gate widths and defect density of IGFET having a gate width of 1 μm

SEMICONDUCTOR DEVICE AND METHOD FOR FABRICATING THE SAME

BACKGROUND OF THE INVENTION

The present invention relates to an insulated gate field effect transistor (which will be herein referred to as a "IGFET") and a semiconductor device using the IGFET.

Figure 8A:
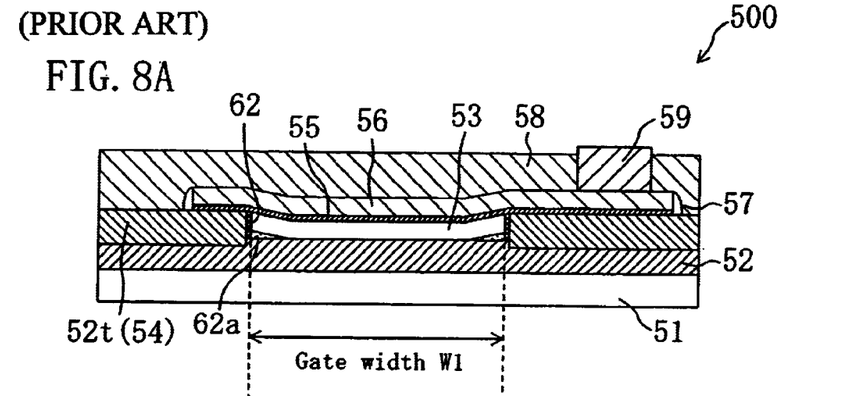
FIG. 8A is a cross-sectional view illustrating the structure of a known IGFET.
Figure 8B:
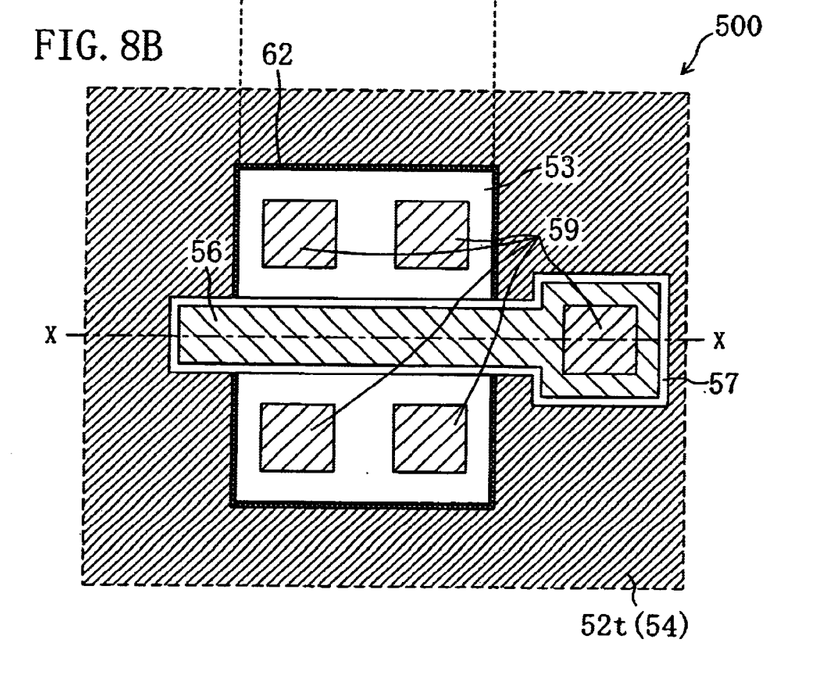
FIG. 8B is a plan view illustrating the structure of the known IGFET.

FIGS. 8A and 8B are cross-sectional and plan views illustrating the structure of a known IGFET, respectively. FIG. 8A illustrates a cross section of the known IGFET taken along the line X—X of FIG. 8B.

As shown in FIGS. 8A and 8B, the known IGFET 500 is formed using an SOI substrate and includes a semiconductor layer 51, a buried insulating film 52, and a semiconductor layer 53 serving as an active region. Furthermore, a trench 52t is provided so as to surround the semiconductor layer 53, and the trench 52t is filled with an insulating film, thereby forming an isolation region 54. On a region of the semiconductor layer 53 which is to be a channel, formed are a gate insulating film 55 and a gate electrode 56 in this order. A gate sidewall spacer 57 is then formed so as to surround the gate electrode 56. Furthermore, an interlevel insulating film 58 is formed on the substrate and then a contact 59 is formed so as to be connected to the gate electrode 56 through the interlevel insulating film 58. The gate width W1 of the semiconductor layer 53 is about 1 $\mu$m. The interlevel insulating film 58 is not shown in FIG. 8B.

Next, a method for fabricating the known IGFET 500 will be described with reference to FIGS. 9A through 9D. FIGS. 9A through 9D are cross-sectional views illustrating respective process steps for fabricating the known IGEFT 500.

Figure 9A:
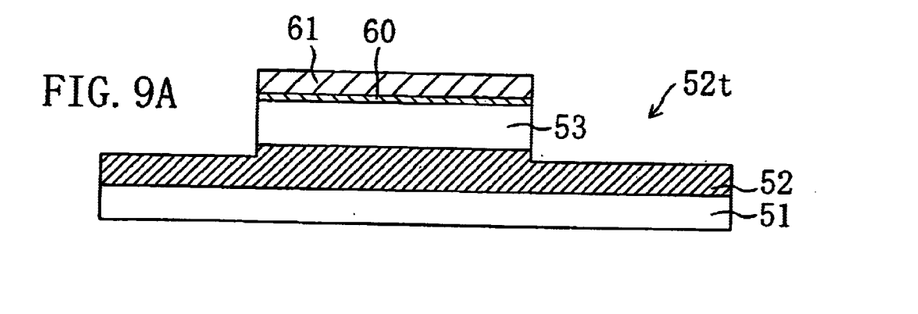
FIGS. 9A through 9D are cross-sectional views illustrating respective process steps for fabricating the known IGFET.

First, in the process step shown in FIG. 9A, an SOI substrate including a semiconductor layer 51, a buried insulating film 52 and a semiconductor layer 53 is prepared. Next, a multilayer film including a silicon oxide film 60 and a silicon nitride film 61 is formed on the SOI substrate and the multilayer film is patterned. Etching is then performed using the patterned multilayer film as a mask to obtain the semiconductor layer 53 serving as an active region and a trench 52t to which part of the buried insulating film 52 is exposed.

Figure 9B:
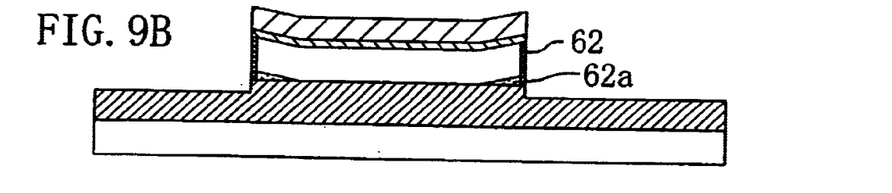

Next, in the process step shown in FIG. 9B, side parts of the semiconductor layer 53 are subjected to preliminary oxidation, thereby forming a side oxide film 62 (having a thickness of about 10 to 30 nm) on the side parts of the semiconductor layer 53. During the preliminary oxidation, an oxidizing agent enters into the interface between the buried insulating film 52 and the semiconductor layer 53 to oxidize the bottom part of the semiconductor layer 53 simultaneously with the side parts of the semiconductor layer 53. As a result, a birds' beak-shaped bottom oxide film 62a is formed. With the bottom oxide film 62a, the peripheral portion of the semiconductor layer 53 is lifted as shown in FIG. 9B, and therefore, the semiconductor layer 53 has a shape in which a depression is made in the center portion thereof (which will be herein referred to as a "wing shape").

Figure 9C:
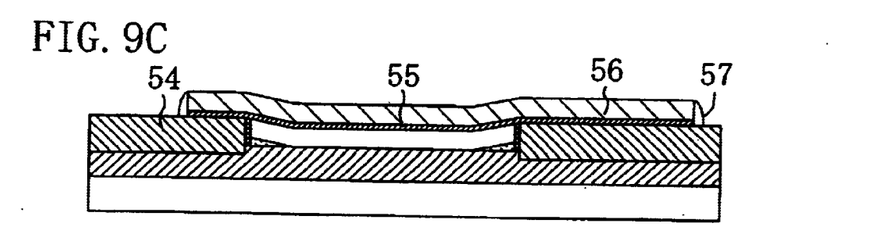

Next, in the process step shown in FIG. 9C, an oxide film is deposited using CVD on the part of the buried insulating film 52 which is exposed to the trench 52t. Subsequently, the upper surface of the substrate is planarized by CMP, and an isolation region 54 is formed. Next, a gate insulating film 55 and a gate electrode 56 are formed and then a gate sidewall spacer 57 is formed. Thereafter, ions of an impurity are implanted using the gate electrode 56 and the gate sidewall spacer 57 as a mask, thereby forming source/drain regions (not shown in FIG. 9C).

Figure 9D:
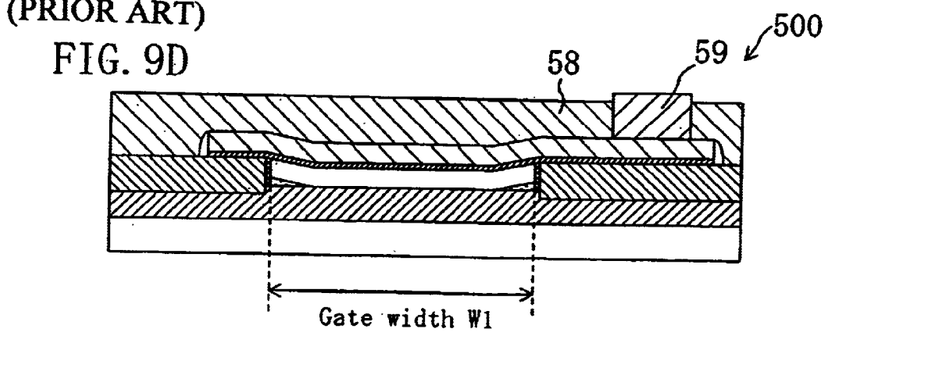

Next, in the process step shown in FIG. 9D, an interlevel insulating film 58 is formed by CVD and then a contact 59 is formed so as to pass through the interlevel insulating film 58 and reach the gate electrode 56.

In the above method for fabricating an IGFET 500, the peripheral portion of the semiconductor layer 53 is lifted, so that the semiconductor layer 53 becomes to have a wing shape as shown in FIG. 9B. This lift is caused by the fact that the gate width W1 of the semiconductor layer 53 is about 1 $\mu$m whereas the bottom oxide film 62a formed by thermal oxidation extends inwardly from each edge of the semiconductor layer 53 only by a distance of about 0.3 $\mu$m. As a result, a crystal strain occurs in the peripheral portion of the semiconductor layer 53 serving as an active region, thus resulting in crystal defects or abnormal diffusion of a dopant impurity in the semiconductor layer 53.

In an IGFET, therefore, leakage of a dopant impurity between the drain and the source due to abnormal diffusion of the dopant impurity of the source region and the drain region, junction leakage between the drain and the substrate, or the like easily occurs. Such leakage causes high fraction defective in the IGFET, resulting in a remarkable reduction in the yield of a semiconductor device using the IGFET.

SUMMARY OF THE INVENTION

The present invention has been devised in order to solve the above-described problems, and it is therefore an object of the present invention to provide a semiconductor device of low fraction defective.

A semiconductor device in accordance with the present invention includes: an insulating layer; a semiconductor region formed on the insulating layer; a trench that surrounds side parts of the semiconductor region and reaches the insulating layer; an isolation insulating film formed in the trench; a semiconductor element in which the semiconductor region serves as an active region; a side oxide film formed by oxidizing the side parts of the semiconductor region and located between the rest of the semiconductor region and the isolation insulating film; and a bottom oxide film that is formed by oxidizing a bottom part of the semiconductor region, is located over the entire interface between the rest of the semiconductor region and the insulating layer, and has side surfaces reaching the side oxide film.

As described above, the semiconductor device of the present invention includes a bottom oxide film that is formed by oxidizing a bottom part of the semiconductor region, is located over the entire interface between the rest of the semiconductor region and the insulating layer, and has side surfaces reaching the side oxide film. This suppressed the occurrence of crystal defects or abnormal diffusion of a dopant impurity in the semiconductor region. Therefore, in the semiconductor element in which the semiconductor region serves as an active region, the occurrence of crystal defects or abnormal diffusion of a dopant impurity can be suppressed.

The semiconductor element may be a FET including a gate insulating film formed on the semiconductor region, a gate electrode formed on the gate insulating film, and source/drain regions formed on both sides of the gate electrode.

The semiconductor region preferably has a length of 0.5 $\mu$m or less in the gate width direction.

Another semiconductor device in accordance with the present invention includes: an insulating layer; a semiconductor region formed on the insulating layer; a trench that surrounds side parts of the semiconductor region and reaches the insulating layer; an isolation insulating film formed in the trench; a gate insulating film formed on the semiconductor region; a gate electrode formed on the gate insulating film; a side oxide film formed by oxidizing the side parts of the semiconductor region and located between the rest of the semiconductor region and the isolation insulating film; and a bottom oxide film that is formed by oxidizing a peripheral portion of a bottom part of the semiconductor region, is located under the peripheral portion of the rest of semiconductor and between the rest of the semiconductor region and the insulating layer, and has side surfaces reaching the side oxide film. In the semiconductor device, the semiconductor region has a length of 2 $\mu$m or more in the gate width direction.

Thus, it is possible to reduce the area ratio of part of the semiconductor region having a crystal strain to the entire semiconductor region. This suppresses the occurrence of crystal defects or abnormal diffusion of a dopant impurity in the semiconductor region. Therefore, in the semiconductor device of the present invention, the occurrence of source-drain leakage due to abnormal diffusion of the dopant impurity in the source and drain regions, source-substrate junction leakage or the like can be suppressed/prevented.

The percentage of the dimension of the bottom oxide film extending inwardly from the side surface of the trench with respect to the dimension of the semiconductor region in the gate width direction is preferably 15% or less.

Still another semiconductor device in accordance with the present invention includes: an insulating layer; first and second semiconductor regions formed on the insulating layer; a trench that surrounds the first and the second semiconductor regions and reaches the insulating layer; an isolation insulating film formed in the trench; a first FET including a first gate insulating film formed on the first semiconductor region, a first gate electrode formed on the first gate insulating film and first source/drain regions formed on both sides of the first gate electrode; a second FET including a second gate insulating film formed on the second semiconductor region, a second gate electrode formed on the second gate insulating film and second source/drain regions formed on both sides of the second gate electrode; a first oxide film formed by oxidizing a bottom part of the first semiconductor region and located over the entire interface between the rest of the first semiconductor region and the insulating layer; and a second oxide film formed by oxidizing a peripheral portion of a bottom part of the rest of the second semiconductor region and located under the peripheral portion of the rest of the second semiconductor region and between the rest of the second semiconductor region and the insulating layer.

According to the present invention, the semiconductor device includes a first oxide film formed by oxidizing a bottom part of the first semiconductor region and located over the entire interface between the rest of the first semiconductor region and the insulating layer. This suppresses the occurrence of a crystal strain in the first semiconductor region in the first FET. Therefore, there can be suppressed the occurrence of crystal defects or abnormal diffusion of a dopant impurity in the peripheral portion of the semiconductor region that is to serve as an active region.

The second semiconductor region preferably has a length of 2 $\mu$m or more in the gate width direction.

Thus, also in the second FET, it is possible to reduce the area ratio of part of the second semiconductor region having a crystal strain to the entire second semiconductor region in the second semiconductor region. This suppresses the occurrence of crystal defects or abnormal diffusion of the dopant impurity in the second semiconductor region.

Each of the first and second gate electrodes may be part of a common linear conductive film.

The first and second gate electrodes may be arranged in parallel to each other.

A method for fabricating a semiconductor device in accordance with the present invention includes the steps of a) preparing a semiconductor substrate including an insulating layer and a semiconductor layer formed on the insulating layer; b) forming a mask on the semiconductor layer and then performing etching using the mask to form a trench for dividing the semiconductor layer into a plurality of semiconductor regions; and c) oxidizing side parts of the plurality of semiconductor regions which are exposed to the trench, wherein in the step b), the semiconductor layer is divided into a plurality of semiconductor regions so that an oxide film to be formed in the step c) is located over the entire interface between each said semiconductor region and the insulating layer and includes side surfaces that reach the trench.

In the fabrication method of the present invention, the semiconductor layer is divided into a plurality of semiconductor regions so that an oxide film to be formed in the step c) is located over the entire interface between each said semiconductor region and the insulating layer and includes side surfaces that reach the trench. This suppresses the occurrence of a crystal strain in each said semiconductor region. Accordingly, there can be achieved a semiconductor device in which the occurrence of a crystal strain or abnormal diffusion of a dopant impurity in a semiconductor region can be suppressed.

In the step b), the semiconductor layer is preferably divided into a plurality of semiconductor regions so that each said semiconductor region has a length of 0.5 $\mu$m or less in the gate width direction.

Thus, the occurrence of a crystal strain in each said semiconductor region can be suppressed to a greater extent.

The inventive method may further includes the steps of: d) forming an isolation insulating film in the trench; e) forming a gate insulating film on each said semiconductor region and then a gate electrode on the gate insulating film; and f) forming source/drain regions on both sides of the gate electrode.

BRIEF DESCRIPTION OF THE DRAWINGS

FIG. 1A illustrates a cross section of the IGFET taken along the line I—I of FIG. 1B.

FIG. 3A illustrates a cross section of the IGFET taken along the line II—II of FIG. 3B.

FIG. 8A illustrates a cross section of the known IGFET taken along the line X—X of FIG. 8B.

DESCRIPTION OF THE PREFERRED EMBODIMENTS

Hereinafter, embodiments of the present invention will be described with reference to accompanying drawings. Components common to the embodiments are identified by the same reference numerals for the convenience's sake.

Embodiment 1

Figure 1A:
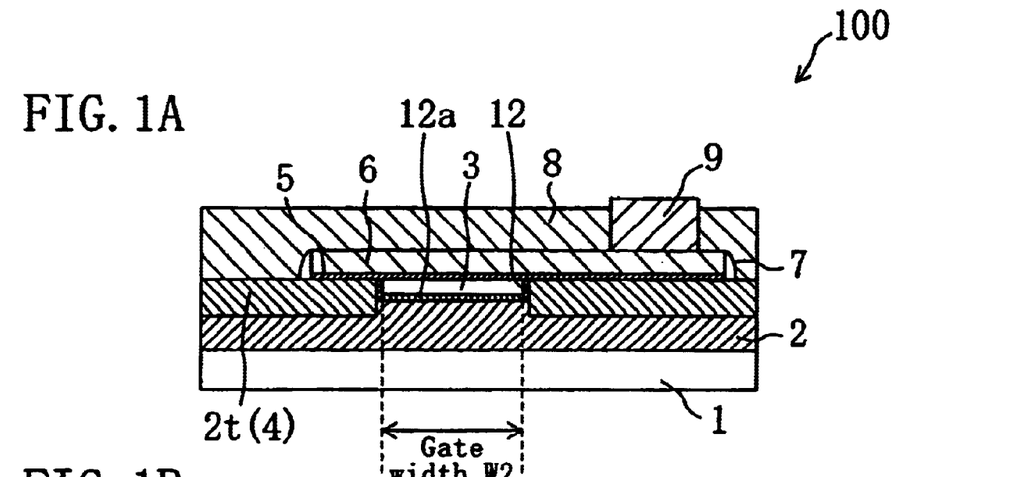
FIG. 1A is a cross-sectional view illustrating the structure of an IGFET in accordance with a first embodiment.
Figure 1B:
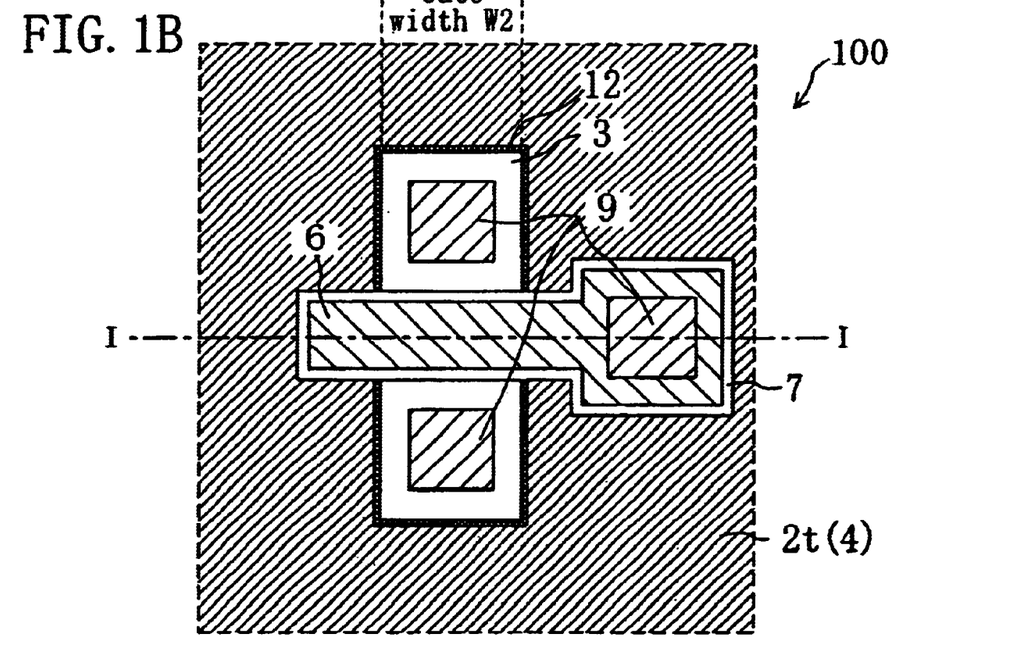
FIG. 1B is a plan view illustrating the structure of the IGFET of the first embodiment.

FIGS. 1A and 1B are cross-sectional and plan views illustrating the structure of an IGFET in accordance with this embodiment, respectively. FIG. 1A illustrates a cross section of the IGFET taken along the line I—I of FIG. 1B.

As shown in FIGS. 1A and 1B, an IGFET 100 is formed using an SOI substrate and includes a semiconductor layer 1, a buried insulating film 2, and a semiconductor layer 3 serving as an active region. Furthermore, a trench 2t is provided so as to surround the semiconductor layer 3, and the trench 2t is filled with an insulating film, thereby forming an isolation region 4. On side parts of the semiconductor layer 3, a side oxide film 12 is formed by thermal oxidation. A bottom oxide film 12a is formed, simultaneously with the side oxide film 12, in the entire bottom part of the semiconductor layer 3. On a region of the semiconductor layer 3 which is to be a channel, formed are a gate insulating film 5 and a gate electrode 6 in this order. A gate sidewall spacer 7 is then formed so as to surround the gate electrode 6. Furthermore, an interlevel insulating film 8 is formed on the substrate and a contact 9 is formed so as to be connected to the gate electrode 6 through the interlevel insulating film 8. The gate width W2 of the semiconductor layer 3 is about 0.5 times as wide as that of the known IGFET 500 (i.e., about 0.5 $\mu$m). The interlevel insulating film 8 is not shown in FIG. 1B.

Next, a method for fabricating the IGFET 100 of this embodiment will be described with reference to FIGS. 2A through 2D. FIGS. 2A through 2D are cross-sectional views illustrating respective process steps for fabricating the IGFET 100 of this embodiment.

Figure 2A:
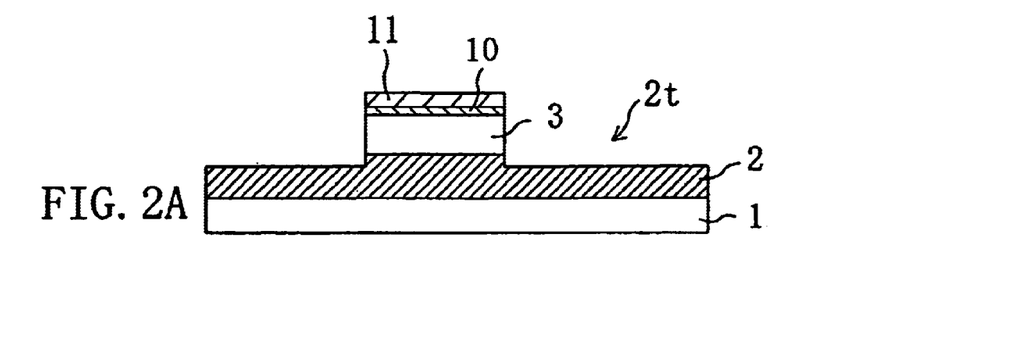
FIGS. 2A through 2D are cross-sectional views illustrating respective process steps for fabricating the IGFET of the first embodiment.

First, in the process step shown in FIG. 2A, an SOI substrate including a semiconductor layer 1, a buried insulating film 2 and a semiconductor layer 3 is prepared. Next, a multilayer film including a silicon oxide film 10 and a silicon nitride film 11 is formed on the semiconductor layer 3 of the SOI substrate and the multilayer film is patterned to have a width of about 0.5 $\mu$m. Subsequently, etching is performed using the patterned multilayer film as a mask to obtain the semiconductor layer 3 of about 0.5 $\mu$m width serving as an active region and a trench 2t to which part of the buried insulating film 2 is exposed.

Figure 2B:
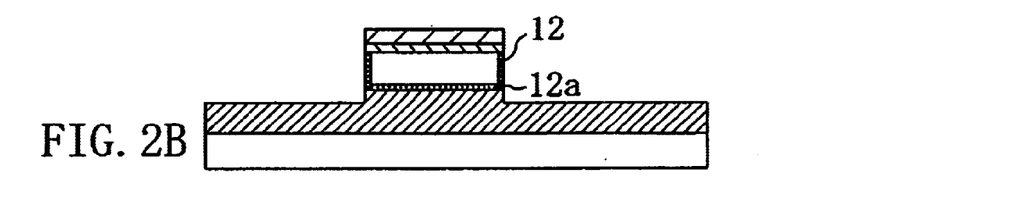

Next, in the process step shown in FIG. 2B, side parts of the semiconductor layer 3 are subjected to preliminary oxidation, thereby forming a side oxide film 12 (having a thickness of about 10 to 30 nm) on the side parts of the semiconductor layer 3. During the preliminary oxidation, an oxidizing agent enters into the interface between the buried insulating film 2 and the semiconductor layer 3 to oxidize the entire bottom part of the semiconductor layer 3 simultaneously with the side parts of the semiconductor layer 3. Thus, a bottom oxide film 12a is formed. In this embodiment, the width of the semiconductor layer 3 that determines the gate width is narrow, i.e., about 0.5 $\mu$m. Therefore, the oxidizing agent enters into the interface from the edges of the semiconductor layer 3 and reaches the center portion of the bottom part of the semiconductor layer 3 during preliminary oxidation by means of thermal oxidation. Accordingly, the bottom oxide film 12a is formed in the entire bottom part of the semiconductor layer 3 with an almost uniform thickness.

Figure 2C:
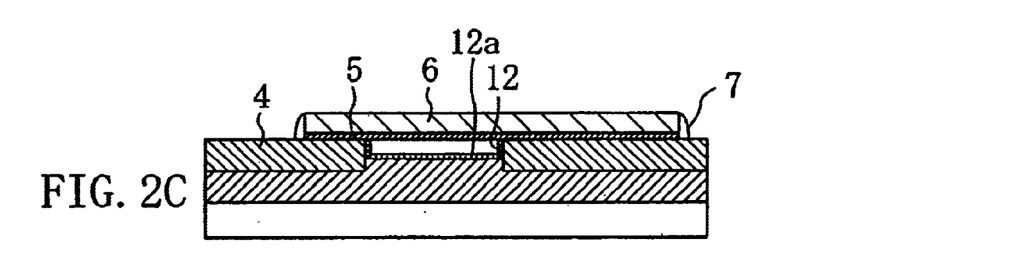

Next, in the process step shown in FIG. 2C, an oxide film is deposited using CVD on part of the buried insulating film 2 which is exposed to the trench 2t. Subsequently, the upper surface of the substrate is planarized by CMP, and an isolation region 4, i.e., the trench 2t filled with an oxide film, is formed. Thereafter, the silicon oxide film 10 and the silicon nitride film 11 are removed. Next, a gate insulating film 5 and a gate electrode 6 are formed and then a gate sidewall spacer 7 is then formed so as to surround the gate electrode 6. Then, ions of an impurity are implanted using the gate electrode 6 and the gate sidewall spacer 7 as a mask, thereby forming source/drain regions (not shown in FIG. 2C).

Figure 2D:
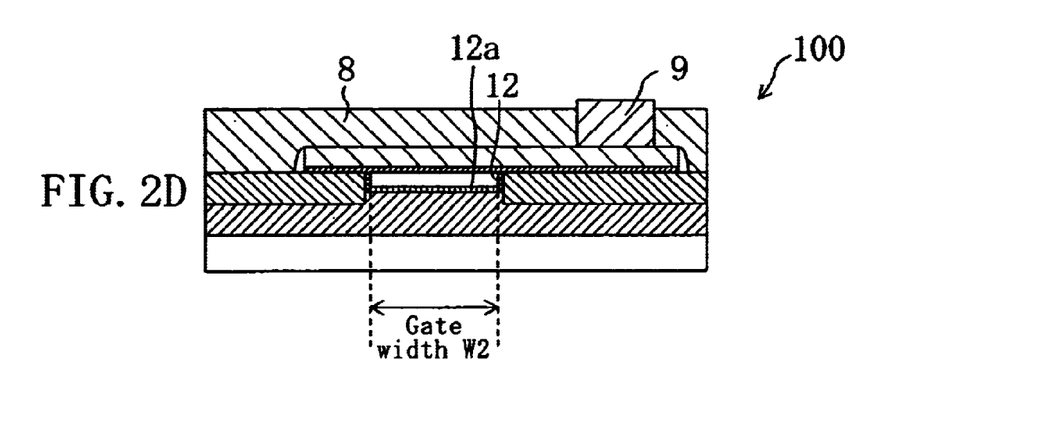

Next, in the process step shown in FIG. 2D, an interlevel insulating film 8 is deposited on the substrate by CVD and then a contact 9 is formed so as to reach the gate electrode 6 or the semiconductor layer 3 (source/drain regions) through the interlevel insulating film 8.

Through the above-described process steps, the IGFET 100 of this embodiment can be obtained.

As has been described, in the process steps for fabricating the known IGFET 500, only the peripheral portion of the semiconductor layer 3 is lifted during preliminary oxidation, so that the semiconductor layer 3 is made into a wing shape in which a depression is made in the center portion thereof. The region of the semiconductor layer 3 lifted through preliminary oxidation is slightly different depending on conditions under which preliminary oxidation is performed. In most cases, however, the lifted region extends inwardly from a facet of the semiconductor layer 3 by a distance of about 0.3 $\mu$m. Thus, a crystal strain easily occurs in a region of the semiconductor layer 3 extending inwardly from the facet by a distance of about 0.3 $\mu$m.

In the IGFET 100 of this embodiment, on the other hand, the width of the semiconductor layer 3 (i.e., gate width W2) is about 0.5 $\mu$m. More specifically, in this embodiment, the width of the semiconductor layer 3 is set smaller than about 0.6 $\mu$m which is the sum of the distance between an inner edge of the bottom oxide film 12a formed by preliminary oxidation and the associated edge of the semiconductor layer 3 and the distance between another inner edge of the bottom oxide film 12a and the associated edge of the semiconductor layer 3 ((a width of about 0.3 $\mu$m of the bottom oxide film 12a extending from one edge of the semiconductor layer 3 and lying under the semiconductor layer 3)×2). Accordingly, the bottom oxide film 12a formed by preliminary oxidation and extending inwardly from the edges of the semiconductor layer 3 reaches the point under the center of the semiconductor region 3. Thus, the entire semiconductor layer 3 is lifted.

Figure 5:
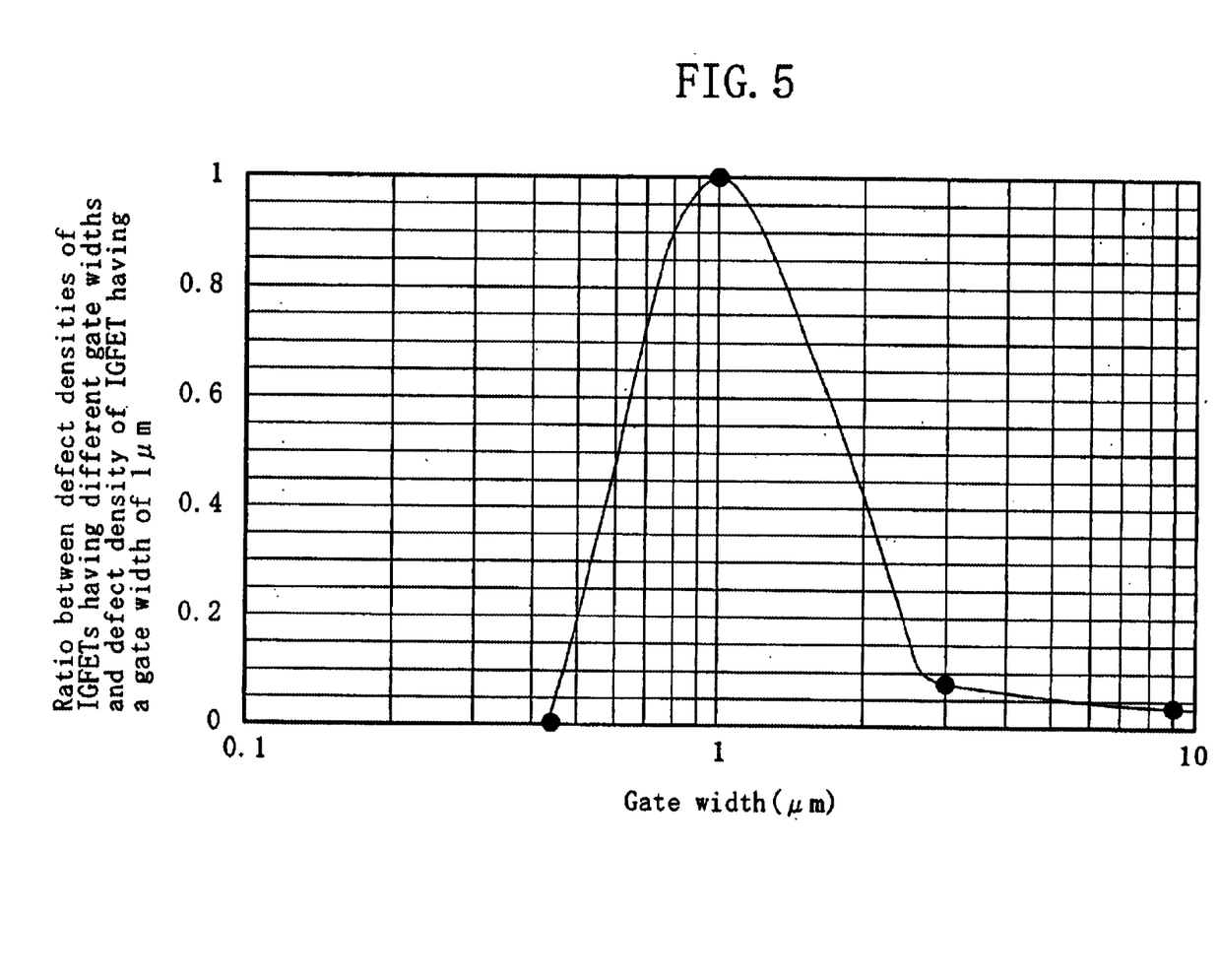
FIG. 5 illustrates the ratio between respective defect densities of IGFETs having different gate widths and the defect density of an IGFET having a gate width of 1 $\mu$m.

FIG. 5 illustrates the ratio between respective defect densities of IGFETs having different gate widths and the defect density of an IGFET having a gate width of 1 μm.

FIG. 5 shows that the defect density of an IGFET having a gate width of 0.5 μm is reduced to one half or less of that of the IGFET having a gate width of 1 μm. That is to say, the gate width is preferably 0.5 μm or less.

Therefore, in this embodiment, formation of the semiconductor layer 3 into a wing shape can be suppressed/prevented, suppressing the occurrence of a crystal strain. This suppresses the occurrence of crystal defects or abnormal diffusion of a dopant impurity in the semiconductor layer 3. Accordingly, in the IGFET 100, the occurrence of source-drain leakage due to abnormal diffusion of a dopant impurity in the source and drain regions, drain-substrate junction leakage or the like can be suppressed/prevented. That is to say, an IGFET of low fraction defective can be achieved.

Embodiment 2

Figure 3A:
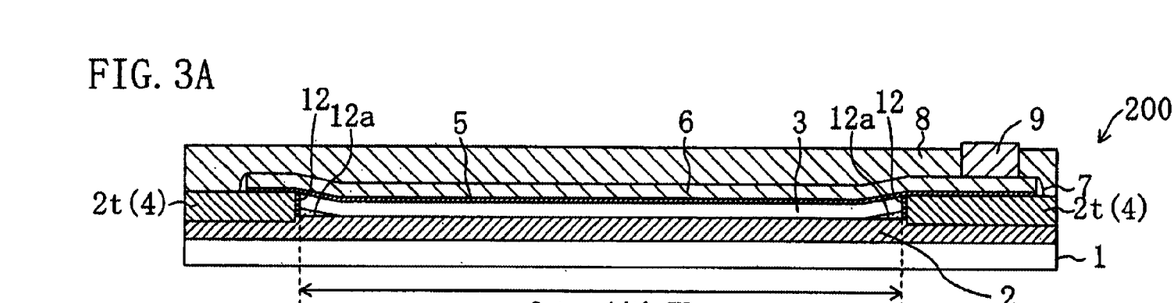
FIG. 3A is a cross-sectional view illustrating the structure of an IGFET in accordance with a second embodiment.
Figure 3B:
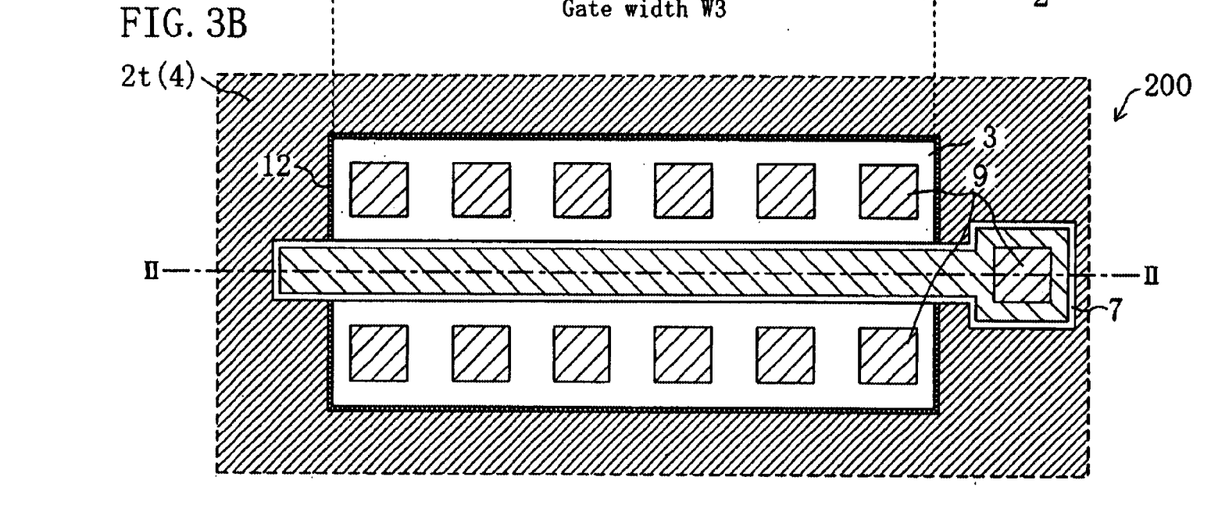
FIG. 3B is a plan view illustrating the structure of the IGFET of the second embodiment.

FIGS. 3A and 3B are cross-sectional and plan views illustrating the structure of an IGFET in accordance with this embodiment, respectively. FIG. 3A illustrates a cross section of the known IGFET taken along the line II—II of FIG. 3B.

As shown in FIGS. 3A and 3B, an IGFET 200 is formed using an SOI substrate and includes a semiconductor layer 1, a buried insulating film 2, and a semiconductor layer 3 serving as an active region. Furthermore, a trench 2t is provided so as to surround the semiconductor layer 3, and an insulating film is filled in the trench 2t, thereby forming an isolation region 4. On side parts of the semiconductor layer 3, a side oxide film 12 is formed by thermal oxidation. A bottom oxide film 12a is formed, simultaneously with the side oxide film 12, in the peripheral portion of the bottom part of the semiconductor layer 3. On a region of the semiconductor layer 3 which is to be a channel, formed are a gate insulating film 5 and a gate electrode 6 in this order. A gate sidewall spacer 7 is then formed so as to surround the gate electrode 6. Furthermore, an interlevel insulating film 8 is formed on the substrate and a contact 9 is formed so as to be connected to the gate electrode 6 through the interlevel insulating film 8. The gate width W3 of the semiconductor layer 3 is about 3 times as wide as that of the known IGFET 500 (about 3 μm). The interlevel insulating film 8 is not shown in FIG. 3B.

A method for fabricating the IGFET 200 of this embodiment will be described with reference to FIGS. 4A through 4D. FIGS. 4A through 4D are cross-sectional views illustrating respective process steps for fabricating the IGFET 200 of this embodiment.

Figures 4A, 4B, 4C:
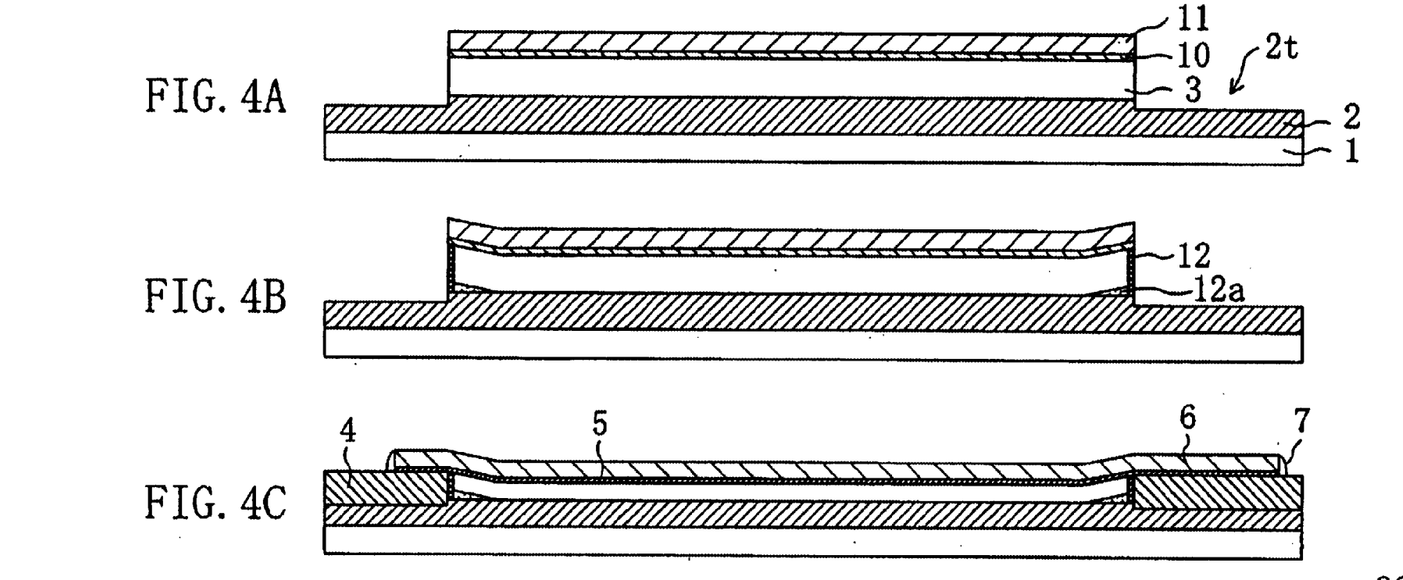
FIGS. 4A through 4D are cross-sectional views illustrating respective process steps for fabricating the IGFET of the second embodiment.

First, in the process step shown in FIG. 4A, an SOI substrate including a semiconductor layer 1, a buried insulating film 2 and a semiconductor layer 3 is prepared. Next, a multilayer film including a silicon oxide film 10 and a silicon nitride film 11 is formed on the semiconductor layer 3 of the SOI substrate and the multilayer is patterned so that the width thereof is about 3 μm. Subsequently, etching is performed using the patterned multilayer film as a mask to obtain the semiconductor layer 3 of about 3 μm width and serving as an active region, and a trench 2t to which part of the buried insulating film 2 is exposed.

Next, in the process step shown in FIG. 4B, side parts of the semiconductor layer 3 are subjected to preliminary oxidation, thereby forming a side oxide film 12 (having a thickness of about 10 to 30 nm) on the side parts of the semiconductor layer 3. During the preliminary oxidation, an oxidizing agent enters into the interface between the buried insulating film 2 and the semiconductor layer 3 to oxidize the bottom part of the semiconductor layer 3 simultaneously with the side parts of the semiconductor layer 3. Thus, a bottom oxide film 12a is formed. In this embodiment, the width of the semiconductor layer 3 that determines the gate width is about 3 μm. Meanwhile, the width of the bottom oxide film 12a formed in the peripheral portion of the bottom part of the semiconductor layer 3 is about 0.3 μm. Accordingly, the ratio of the width of the bottom oxide film 12a to the gate width of the semiconductor layer is very low.

Next, in the process step shown in FIG. 4C, an oxide film is deposited using CVD on part of the buried insulating film 2 which is exposed to the trench 2t. Subsequently, the upper surface of the substrate is planarized by CMP, and an isolation region 4, i.e., the trench 2t filled with an oxide film filled, is formed. Thereafter, the silicon oxide film 10 and the silicon nitride film 11 are removed. Next, a gate insulating film 5 and a gate electrode 6 are formed and then a gate sidewall spacer 7 is formed so as to surround the gate electrode 6. Then, ions of an impurity are implanted using the gate electrode 6 and the gate sidewall spacer 7 as a mask, thereby forming source/drain regions (not shown in FIG. 4C).

Figure 4D:
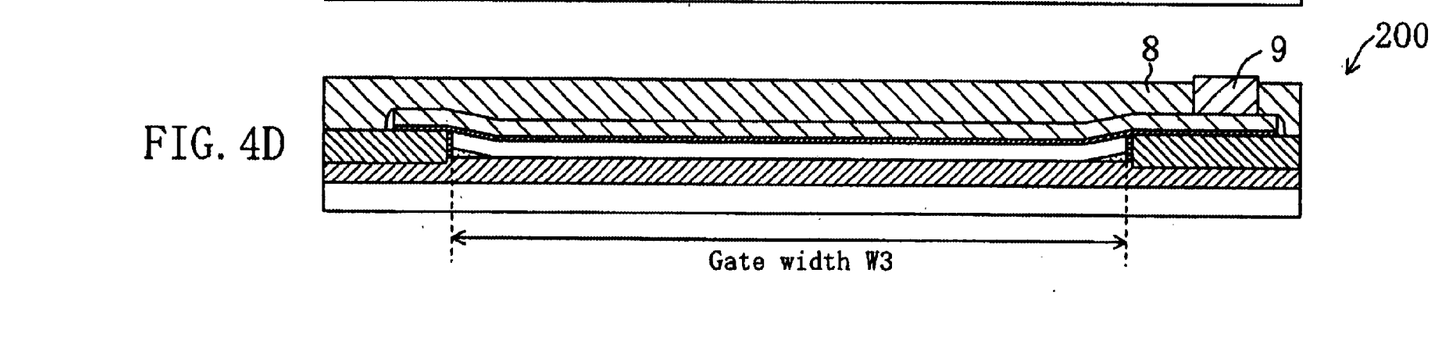

Next, in the process step shown in FIG. 4D, an interlevel insulating film 8 is deposited on the substrate by CVD and then a contact 9 is formed so as to reach the gate electrode 6 or the semiconductor layer 3 (source/drain regions) through the interlevel insulating film 8.

Through the above-described process steps, the IGFET 200 of this embodiment can be obtained.

As has been described in this embodiment, the width of the semiconductor layer 3 that serves as an active region and determines the gate width is set at a value (W3: 3 μm) about five times as large as about 0.6 μm which is the sum of the distance between an inner edge of the bottom oxide film 12a formed by preliminary oxidation and the associated edge of the semiconductor layer 3 and the distance between another inner edge of the bottom oxide film 12a and the associated edge of the semiconductor layer 3 ((a width of about 0.3 μm of the bottom oxide film 12a extending from one edge of the semiconductor layer 3 and lying under the semiconductor layer 3)×2). Thus, in the semiconductor layer 3 serving as an active region, the area ratio of a region having a crystal strain due to formation of a wing shape to the entire semiconductor layer 3 can be reduced.

FIG. 5 illustrates the ratio between respective defect densities of IGFETs having different gate widths and the defect density of an IGFET having a gate width of 1 μm.

FIG. 5 shows that the defect density of the IGFET having a gate width of 2 μm is reduced to one half or less of that of the IGFET having a gate width of 1 μm; and the defect density of an IGFET having a gate width of 3 μm is reduced to one tenth or less of that of the IGFET having a gate width of 1 μm. That is to say, the gate width is preferably 2 μm or more, and more preferably 3 μm or more.

More specifically, in fabrication process steps of the known IGFET 500, the region of the semiconductor layer 3 lifted by preliminary oxidation extends inwardly from a facet of the semiconductor layer 3 by a distance of about 0.3 μm in most cases. However, the region is slightly changes depending on conditions under which preliminary oxidation is performed. Therefore, it is preferable to adjust the gate width W3 such that the percentage of the region lifted by preliminary oxidation with respect to the gate width of the semiconductor layer 3 is 15% or less.

Therefore, in this embodiment, by making the gate width sufficiently wider than the width of the peripheral portion of the semiconductor layer 3 lifted due to formation of a wing shape, the occurrence of a crystal strain in the semiconductor layer 3 serving as an active region is reduced. This suppresses the occurrence of crystal defects or abnormal diffusion of a dopant impurity in the semiconductor layer 3. In the IGFET 200, therefore, the occurrence of source-drain leakage due to abnormal diffusion of a dopant impurity in the source and drain regions, drain-substrate junction leakage or the like can be suppressed/prevented. That is to say, an IGFET of low fraction defective can be achieved.

Embodiment 3

Figure 6:
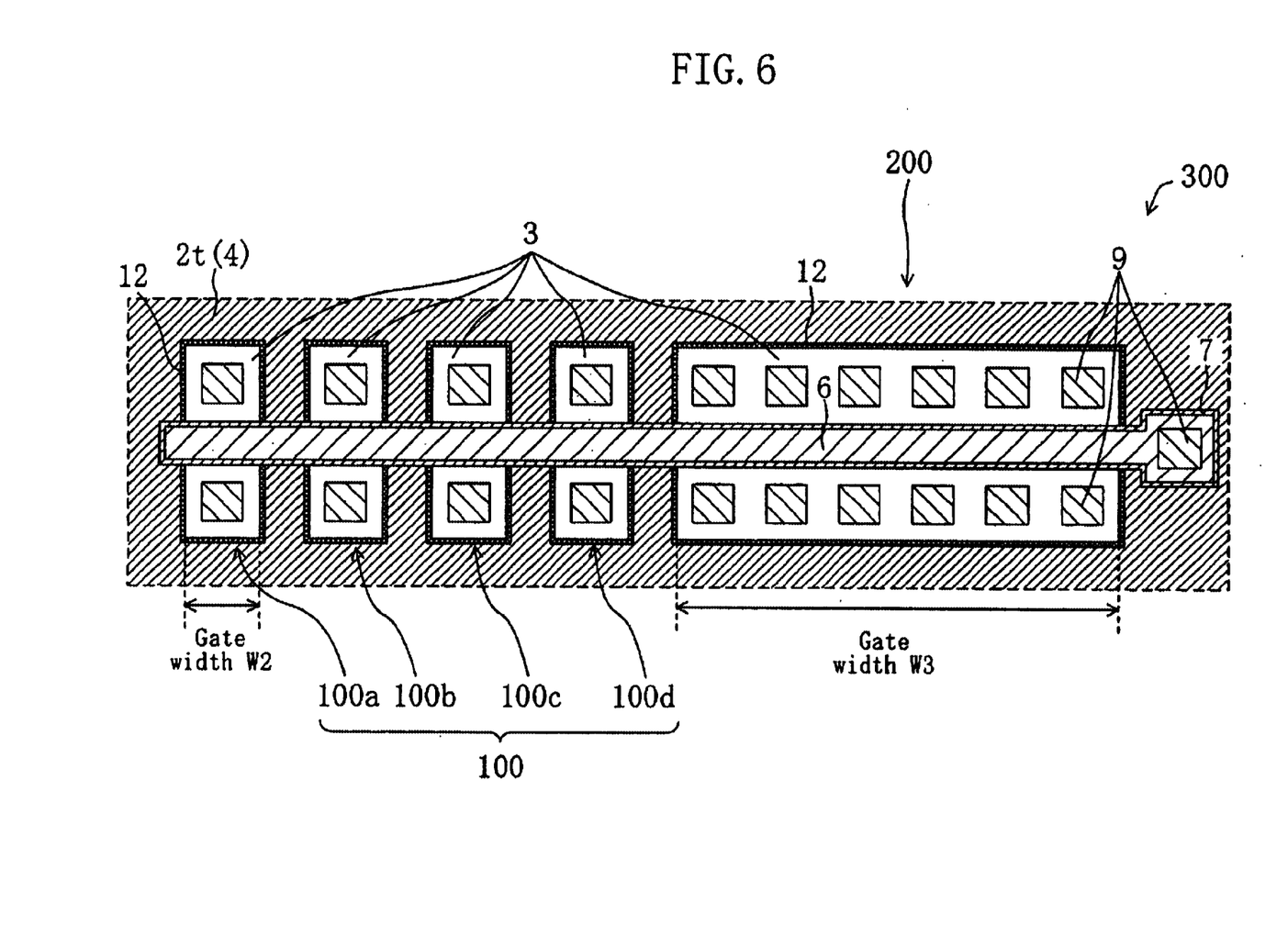
FIG. 6 is a plan view illustrating the structure of a semiconductor device in accordance with a third embodiment.

FIG. 6 is a plan view illustrating the structure of a semiconductor device in accordance with a third embodiment.

A semiconductor device 300 according to this embodiment, specifically, includes four IGFETs 100a, 100b, 100c and 100d, and an IGFET 200 which are arranged in series in the gate width direction, and a gate electrode 6 is shared in common by the IGFETs.

More specifically, in this embodiment, the semiconductor layer 3 serving as an active region is divided into parts. The width (gate width) of each divided part of the semiconductor layer 3 is either the gate width W2 (about 0.5 $\mu$m) in the first embodiment or the gate width W3 (about 3 $\mu$m) in the second embodiment. The gate width W3 of the IGFET 200 is preferably 2 $\mu$m or more.

Furthermore, in this embodiment, the IGFET 100 having the smaller gate width W2 than the IGFET 200 is provided on part of the substrate located further from the contact 9 of the gate electrode 6.

In the semiconductor device 300 of this embodiment, there is suppressed/prevented the occurrence of a crystal strain in the peripheral portion of the semiconductor layer 3 serving as an active region in each IGFET due to formation of a wing shape of the semiconductor layer 3 as described in the first and second embodiments. Accordingly, the occurrence of crystal defects and abnormal diffusion of a dopant impurity can be suppressed. Thus, in each IGFET, the occurrence of source-drain leakage due to abnormal diffusion of a dopant impurity in the source and drain regions and the occurrence of drain-substrate junction leakage can be suppressed/prevented. Therefore, a semiconductor device in which each IGFET has low fraction defective can be obtained.

Furthermore, in the semiconductor device 300 of this embodiment, the IGFET 100 having the smaller gate width W2 than the IGFET 200 is provided on part of the substrate located further from the contact 9 of the gate electrode 6. Thus, by changing the length of the gate electrode 6, the number of IGFETs 100 of the semiconductor device 300 can be adjusted in the range from 0 to 4. Since the gate width W2 of the IGFET 100 is smaller than the gate width W3 of the IGFET 200, smaller drive current is required for the IGFET 100 than that of the IGFET 200. Therefore, drive current can be fine-adjusted in a simple manner by adjusting the number of IGFETs 100.

More specifically, when the length of the gate electrode 6 is intended to be changed, a photomask need only be changed in the process step of forming the gate electrode 6. Therefore, a semiconductor device operable at various drive current levels can be fabricated in a simple manner. That is to say, according to this embodiment, a semiconductor device usable for various purposes can be provided.

Embodiment 4

Figure 7:
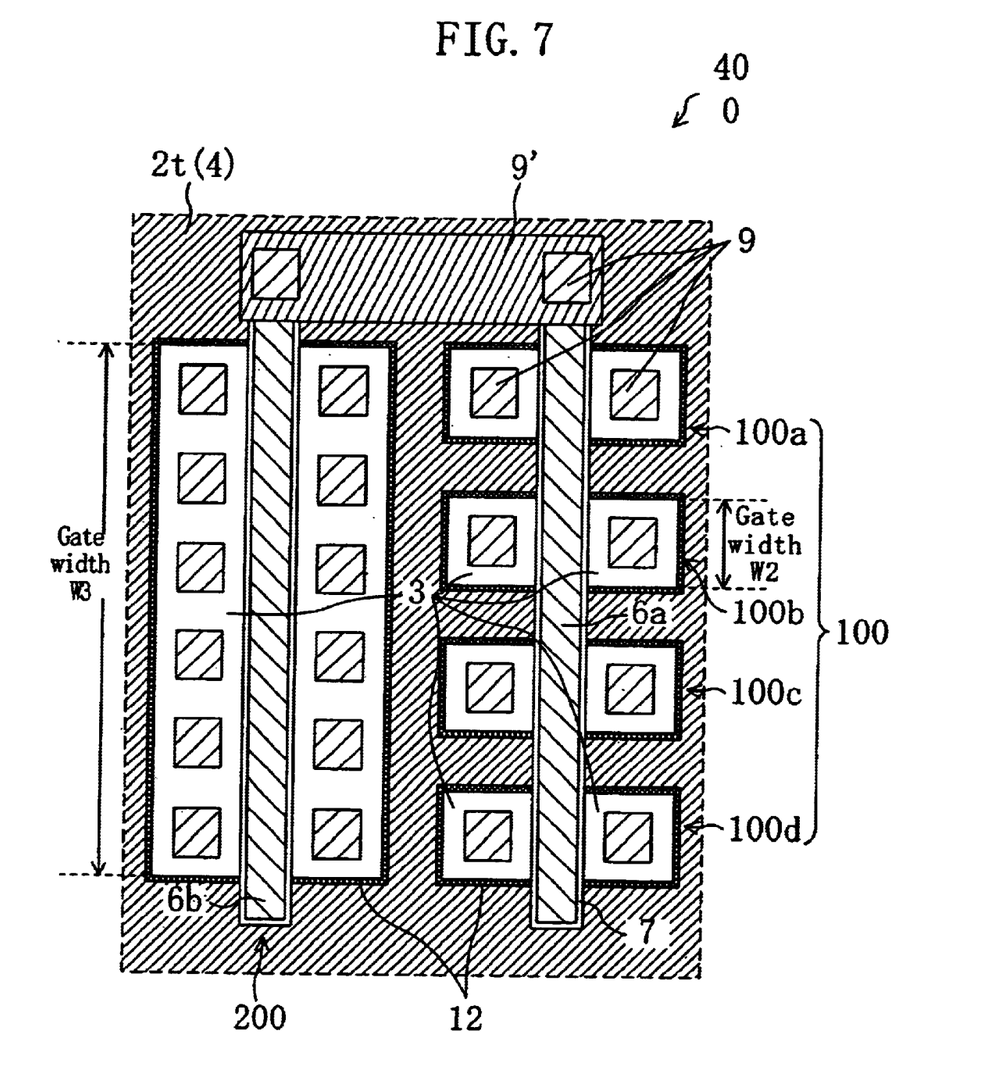
FIG. 7 is a plan view illustrating the structure of a semiconductor device in accordance with a fourth embodiment.

FIG. 7 is a plan view illustrating the structure of a semiconductor device in accordance with a fourth embodiment.

As shown in FIG. 7, a semiconductor device 400 according to this embodiment is formed as a combination of the IGFET 100 of the first embodiment and the IGFET 200 of the second embodiment. Specifically, in the semiconductor device 400, four IGFETs 100a, 100b, 100c and 100d arranged in series in the gate width direction and having a common gate electrode 6a, and an IGFET 200 having a gate electrode 6b are arranged in series in the gate width direction. The gate electrode 6a is connected to the gate electrode 6b in the IGFET 200 via a metal interconnect 9'.

More specifically, in this embodiment, the semiconductor layer 3 serving as an active region is divided into parts and the width (gate width) of each divided part of the semiconductor layer 3 is either the gate width W2 (about 0.5 $\mu$m) in the first embodiment or the gate width W3 (about 3 $\mu$m) in the second embodiment.

Also, in the semiconductor device 400 of this embodiment, there is suppressed/prevented the occurrence of a crystal strain in the peripheral portion of the semiconductor layer 3 serving as an active region in each IGFET due to formation of a wing shape of the semiconductor layer 3, as in the third embodiment. Accordingly, the occurrence of crystal defects or abnormal diffusion of a dopant impurity can be suppressed. Thus, in each IGFET, the occurrence of source-drain leakage due to abnormal diffusion of a dopant impurity in the source and drain regions and the occurrence of drain-substrate junction leakage can be suppressed/prevented. Therefore, a semiconductor device in which each IGFET has low fraction defective can be obtained.

Furthermore, in the semiconductor device 400 of this embodiment, the number of IGFETs to be installed can be adjusted in the range from 0 to 4 by changing the length of the gate electrode 6a. Since the gate width W2 of the IGFET 100 is smaller than the gate width W3 of the IGFET 200, smaller drive current is required for the IGFET 100 than that of the IGFET 200. Therefore, drive current can be fine-adjusted by adjusting the number of IGFETs 100 in a simple manner. Specifically, when the length of the gate electrode 6a is intended to be changed, a photomask need only be changed in the process step of forming the gate electrode 6. Therefore, a semiconductor device operable at various drive current levels can be fabricated in a simple manner. That is to say, according to this embodiment, a semiconductor device usable for various purposes can be provided.

In the third embodiment, an increase in the length of the gate electrode 6 increases the gate resistance, which may lead to degraded performance of each IGFET. In this embodiment, however, the semiconductor device has the structure in which a plurality of gate electrodes are connected with each other via a metal interconnect, and thus the degradation of performance due to an increased gate resistance can be prevented in each IGFET.

According to the present invention, an IGFET of low fraction defective can be provided. Moreover, an IGFET in which drive current can be fine-adjusted in a simple manner can be provided.

What is claimed is:
1. A semiconductor device, comprising:
an insulating layer;
a semiconductor region formed on the insulating layer;
a trench that surrounds side parts of the semiconductor region and reaches the insulating layer;

an isolation insulating film formed in the trench;

a semiconductor element in which the semiconductor region serves as an active region;

a side oxide film formed by thermally oxidizing the side parts of the semiconductor region and located between the rest of the semiconductor region and the isolation insulating film; and a bottom oxide film that is formed by thermally oxidizing a bottom part of the semiconductor region, is located over the entire interface between the rest of the semiconductor region and the insulating layer, and has side surfaces reaching the side oxide film, wherein the side oxide film and the bottom oxide film are integrally formed.

2. The semiconductor device of claim 1, wherein the semiconductor element is a FET including a gate insulating film formed on the semiconductor region, a gate electrode formed on the gate insulating film and source/drain regions formed on both sides of the gate electrode.

3. The semiconductor device of claim 2, wherein the semiconductor region has a length of 0.5 $\mu$m or less in the gate width direction.

4. A semiconductor device, comprising:

an insulating layer;

a semiconductor region formed on the insulating layer;

a trench that surrounds side parts of the semiconductor region and reaches the insulating layer;

an isolation insulating film formed in the trench;

a gate insulating film formed on the semiconductor region;

a gate electrode formed on the gate insulating film;

a side oxide film formed by thermally oxidizing the side part of the semiconductor region and located between the rest of the semiconductor region and the isolation insulating film; and a bottom oxide film that is formed by thermally oxidizing a peripheral portion of a bottom part of the semiconductor region, is located under the peripheral portion of the rest of the semiconductor region and between the rest of the semiconductor region and the insulating layer, and has side surfaces reaching the side oxide film, wherein the side oxide film and the bottom oxide film are integrally formed; and the semiconductor region has a length of five or more times as large as a sum of a distance between an inner edge of the bottom oxide film, which is formed on both sides under the peripheral portion of the rest of the semiconductor region, and an associated edge of the semiconductor region in the gate width direction.

5. The semiconductor device of claim 4, wherein the percentage of the dimension of the bottom oxide film extending inwardly from the side surface of the trench with respect to the dimension of the semiconductor region in the gate width direction is 15% or less.

6. A semiconductor device, comprising:

an insulating layer;

first and second semiconductor regions formed on the insulating layer;

a trench that surrounds the first and the second semiconductor regions and reaches the insulating layer;

an isolation insulating film formed in the trench;

a first FET including a first gate insulating film formed on the first semiconductor region, a first gate electrode formed on the first gate insulating film and first source/drain regions formed on both sides of the first gate electrode;

a second FET including a second gate insulating film formed on the second semiconductor region, a second gate electrode formed on the second gate insulating film and second source/drain regions formed on both sides of the second gate electrode;

a first oxide film formed by thermally oxidizing a bottom part of the first semiconductor region and located over the entire interface between the rest of the first semiconductor region and the insulating layer;

a second oxide film formed by thermally oxidizing a peripheral portion of a bottom part of the rest of the second semiconductor region and located under the peripheral portion of the rest of the second semiconductor region and between the rest of the second semiconductor region and the insulating layer;

a third oxide film formed between the first semiconductor region and the isolation insulating film by thermally oxidizing the side of the first semiconductor region; and a fourth oxide film formed between the second semiconductor region and the isolation insulating film by thermally oxidizing the side of the second semiconductor region, wherein each of the first oxide film and the third oxide film, and the second oxide film and the fourth oxide film are integrally formed, and the first gate electrode and the second gate electrode are electrically connected.

7. The semiconductor device of claim 6, wherein the second semiconductor region has a length of five or more times as large as a sum of a distance between an inner edge of the bottom oxide film, which is formed on both sides under the peripheral portion of the rest of the second semiconductor region, and an associated edge of the second semiconductor region in the gate width direction.

8. The semiconductor device of clam 6, wherein each of the first and second gate electrodes is part of a common linear conductive film.

9. The semiconductor device of claim 6, wherein the first and second gate electrodes are arranged in parallel to each other.

* * * * *